(12) United States Patent
Butler

(10) Patent No.: US 10,921,720 B2
(45) Date of Patent: Feb. 16, 2021

(54) SUPPORT STRUCTURE, METHOD AND LITHOGRAPHIC APPARATUS

(71) Applicant: ASML Netherlands B.V., Veldhoven (NL)

(72) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/606,398

(22) PCT Filed: Mar. 28, 2018

(86) PCT No.: PCT/EP2018/057887
§ 371 (c)(1),
(2) Date: Oct. 18, 2019

(87) PCT Pub. No.: WO2018/192759
PCT Pub. Date: Oct. 25, 2018

(65) Prior Publication Data
US 2020/0124991 A1   Apr. 23, 2020

(30) Foreign Application Priority Data

Apr. 20, 2017 (EP) .................................. 17167347

(51) Int. Cl.
*G03F 7/20* (2006.01)

(52) U.S. Cl.
CPC .......... *G03F 7/70833* (2013.01); *G03F 7/709* (2013.01); *G03F 7/70825* (2013.01)

(58) Field of Classification Search
CPC .. G03F 7/70825; G03F 7/709; G03F 7/70833; G03F 7/70691; G03F 7/70716;
(Continued)

(56) References Cited

U.S. PATENT DOCUMENTS

| 5,310,157 A | * | 5/1994 | Platus | ..................... F16F 3/026 248/619 |
| 5,478,043 A | | 12/1995 | Wakui | |

(Continued)

FOREIGN PATENT DOCUMENTS

| EP | 2 447 777 A2 | 5/2012 |
| EP | 2 447 777 A3 | 5/2015 |

(Continued)

OTHER PUBLICATIONS

International Search Report and Written Opinion of the International Searching Authority directed to related International Patent Application No. PCT/EP2018/057887, dated Jul. 6, 2018; 9 pages.

(Continued)

*Primary Examiner* — Christina A Riddle
(74) *Attorney, Agent, or Firm* — Sterne, Kessler, Goldstein & Fox P.L.L.C.

(57) ABSTRACT

The invention relates to support structure, comprising: a first body; a second body; a first support having a first stiffness; a second support having a second stiffness, wherein the second body supports the first body at a first location via the first support, wherein the second body supports the first body at a second location via the second support; a position measurement system arranged to generate a deformation signal representative of a difference of deformation of the first body and the second body relative to each other; a first actuator to apply a force between the first body and the second body at or near the first location; a second actuator to apply a force between the first body and the second and body at or near the second location; wherein the support structure comprises a controller arranged to determine a deformation compensation signal on the basis of the first stiffness, the second stiffness and the deformation signal and to drive at least one of the first actuator and the second (Continued)

actuator on the basis of the deformation compensation signal to prevent or at least reduce deformation of the first body.

15 Claims, 4 Drawing Sheets

(58) Field of Classification Search
CPC ............ G03F 7/70725; G03F 7/70758; G03F 7/70766; G03F 7/70775; G03F 7/70783; G03F 7/70791; G03F 7/708; G03F 7/70816; G03F 7/7085; G02B 7/1827
USPC .......................................... 355/52–55, 67–77
See application file for complete search history.

(56) References Cited

U.S. PATENT DOCUMENTS

| | | | |
|---|---|---|---|
| 6,021,991 A | | 2/2000 | Mayama et al. |
| 6,330,052 B1* | | 12/2001 | Yonekawa .......... G03F 7/70691 |
| | | | 355/53 |
| 2011/0026004 A1* | | 2/2011 | Van Eijk ................ G03B 27/58 |
| | | | 355/72 |
| 2011/0164230 A1* | | 7/2011 | Ito ....................... G03F 7/70725 |
| | | | 355/53 |
| 2011/0170078 A1 | | 7/2011 | Loopstra et al. |
| 2014/0185029 A1* | | 7/2014 | Kwan ................... G03F 7/7015 |
| | | | 355/72 |

FOREIGN PATENT DOCUMENTS

| | | |
|---|---|---|
| EP | 3 026 291 A1 | 6/2016 |
| JP | H0783276 A | 3/1995 |
| JP | H10-259851 A | 9/1998 |
| JP | 2007-010002 A | 1/2007 |
| JP | 2007-247822 A | 9/2007 |
| JP | 2011-247314 A | 12/2011 |
| WO | WO 2013/164145 A1 | 11/2013 |
| WO | WO 2016/139012 A1 | 9/2016 |

OTHER PUBLICATIONS

International Preliminary Report on Patentability directed to related International Patent Application No. PCT/EP2018/057887, dated Oct. 22, 2019; 7 pages.

* cited by examiner

SUPPORT STRUCTURE, METHOD AND LITHOGRAPHIC APPARATUS

CROSS-REFERENCE TO RELATED APPLICATIONS

This application claims priority of EP application 17167347.8 which was filed on 20 Apr. 2017 and which is incorporated herein in its entirety by reference.

FIELD OF THE INVENTION

The present invention relates to a support structure arranged to support a first body by a second body. The invention further relates to a method to prevent or at least decrease the transfer of deformation from a second body to a first body supported by the second body, and a lithographic apparatus comprising the support structure.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, vibration isolation systems are used to support a first body of the lithographic apparatus with respect to a second body, while at the same time transfer of vibrations from the second body of the lithographic apparatus to the first body of the lithographic apparatus, or vice versa, are prevented or at least minimized. Examples of vibration isolation systems are for example air mounts.

An example of a structure in which a vibration isolation system may be used is the support structure for one or more sensors configured to determine a position of a mirror element of a projection system, e.g. a projection optics box, of a lithographic apparatus. It is of importance that vibrations, for instance originating from a floor surface of a factory, are not transferred to the one or more sensors. Transferring vibrations would negatively influence the line of sight, i.e. the measurement direction, of the one or more sensors, and therewith would have negative result on the accuracy of the lithographic process, for example the overlay or focus obtained during the lithographic process.

The support structure may be designed as follows. A base frame is arranged on a floor surface and supports a force frame. One or more vibration isolation systems comprising an air mount are arranged between the base frame and the force frame to at least partly isolate the force frame from vibrations of the base frame. The force frame supports in its turn a sensor frame on which the one or more sensors are mounted.

To optimize the sensor performance of a sensor mounted on the sensor frame, it is advantageous to provide vibration isolation systems between the force frame and the sensor frame. In an embodiment, four vibration isolation systems are arranged between the force frame and the sensor frame to provide a proper support for the sensor frame. The four vibration isolation system are capable of substantially reducing the transfer of vibrations above a certain cut-off frequency of for example 6 Hz from the force frame to the sensor frame.

In the force frame deformations may occur. These deformations in the force frame may for example be induced by the vibration isolation systems provided between the base frame and the force frame, by disturbances caused by flow-induced vibrations or by dynamic links stiffness, for instance cables running from the base frame to the force frame.

Since the support between the force frame and the sensor frame is overdetermined, as four vibration isolation systems are used to support the sensor frame in the vertical direction, a deformation of the force frame may be transferred to the sensor frame, in particular in the vertical direction. Since a small deformation in the sensor frame may have a large effect on the line of sight of a sensor arranged on the sensor frame, it is undesirable that deformations are present in the sensor frame.

Therefore, a drawback of providing four vibration isolation systems between the force frame and the sensor frame to support the sensor frame is that a deformation of the force frame may be transferred to the sensor frame.

SUMMARY OF THE INVENTION

It is an object of the invention to provide a support structure, in particular a support structure for a sensor frame of a projection system of a lithographic apparatus, that is capable of preventing or at least reducing the transfer of deformations from a second body to a first body supported by the second body. It is a further object of the invention to provide a method to prevent or at least reduce the transfer of deformations from a second body to a first body supported by the second body.

According to an aspect of the invention, there is provided a support structure, comprising:
  a first body;
  a second body;
  a first support having a first stiffness;
  a second support having a second stiffness,
  wherein the second body supports the first body at a first location via the first support,
  wherein the second body supports the first body at a second location via the second support;
  a position measurement system arranged to generate a deformation signal representative of a difference of deformation of the first body and the second body relative to each other;
  a first actuator to apply a force between the first body and the second body at or near the first location;
  a second actuator to apply a force between the first body and the second body at or near the second location;
  wherein the support structure comprises a controller arranged to determine a deformation compensation signal on the basis of the first stiffness, the second stiffness and the deformation signal and to drive at least one of the first actuator and the second actuator on the basis of the deformation compensation signal to prevent or at least reduce deformation of the first body.

According to an aspect of the invention, there is provided a method to prevent or at least reduce the transfer of deformation from a second body to a first body supported by the second body with at least two supports each having a stiffness and provided at a different support locations of the first body, comprising:

generating a deformation signal representative of a difference of deformation of the first body and the second body relative to each other;

determining a deformation compensation signal on the basis of the stiffness of each the supports and the deformation signal, and driving at least one of one or more actuators provided between the first body and the second body on the basis of the deformation compensation signal to prevent or at least reduce deformation of the first body.

According to an aspect of the invention, there is provided a lithographic apparatus comprising:

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

wherein the lithographic apparatus comprises the support structure of claim 1 arranged to support a first body of the lithographic apparatus with respect to a second body of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
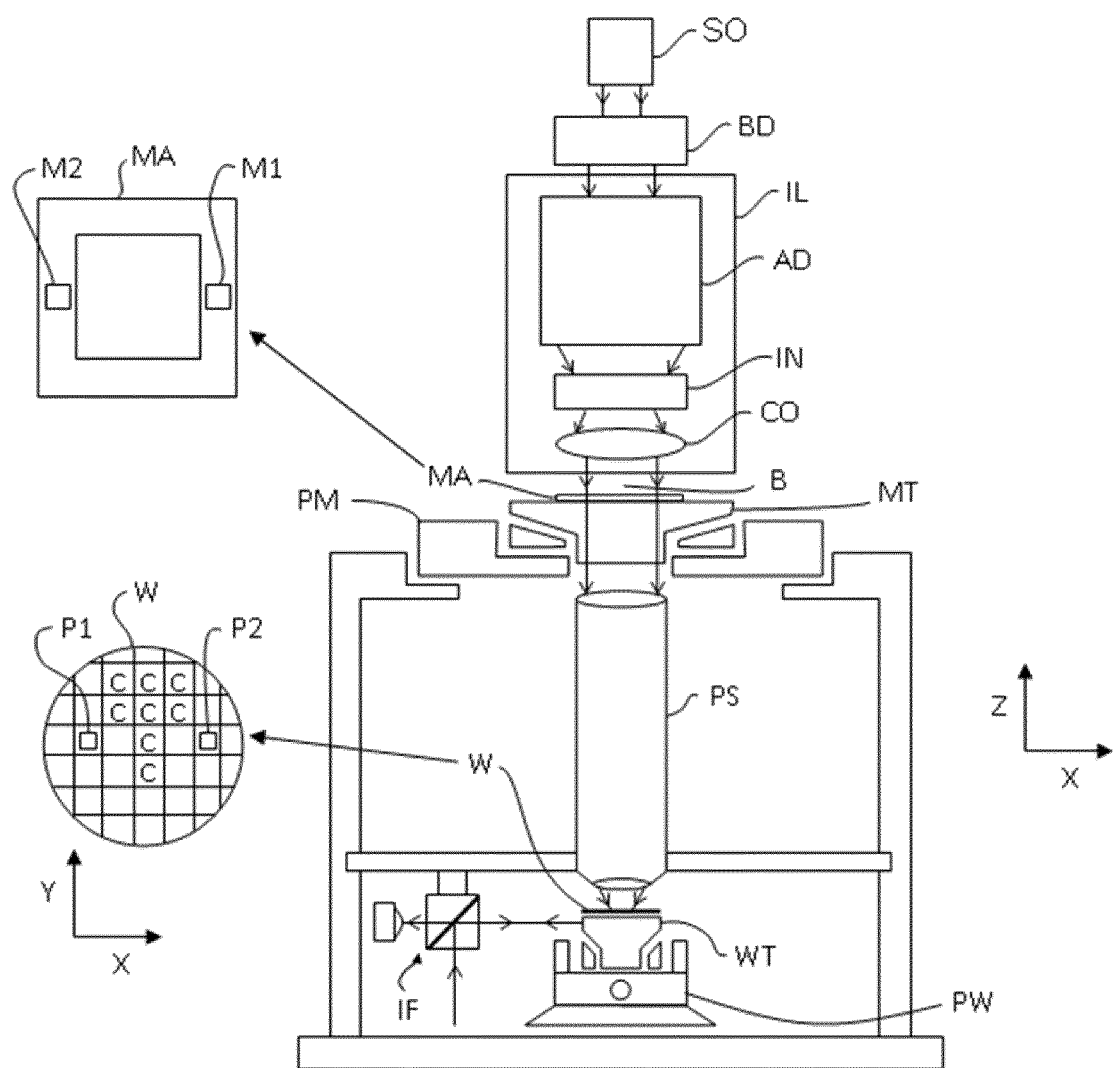
FIG. 1 depicts a lithographic apparatus in which embodiments of the invention may be provided.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system PS may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
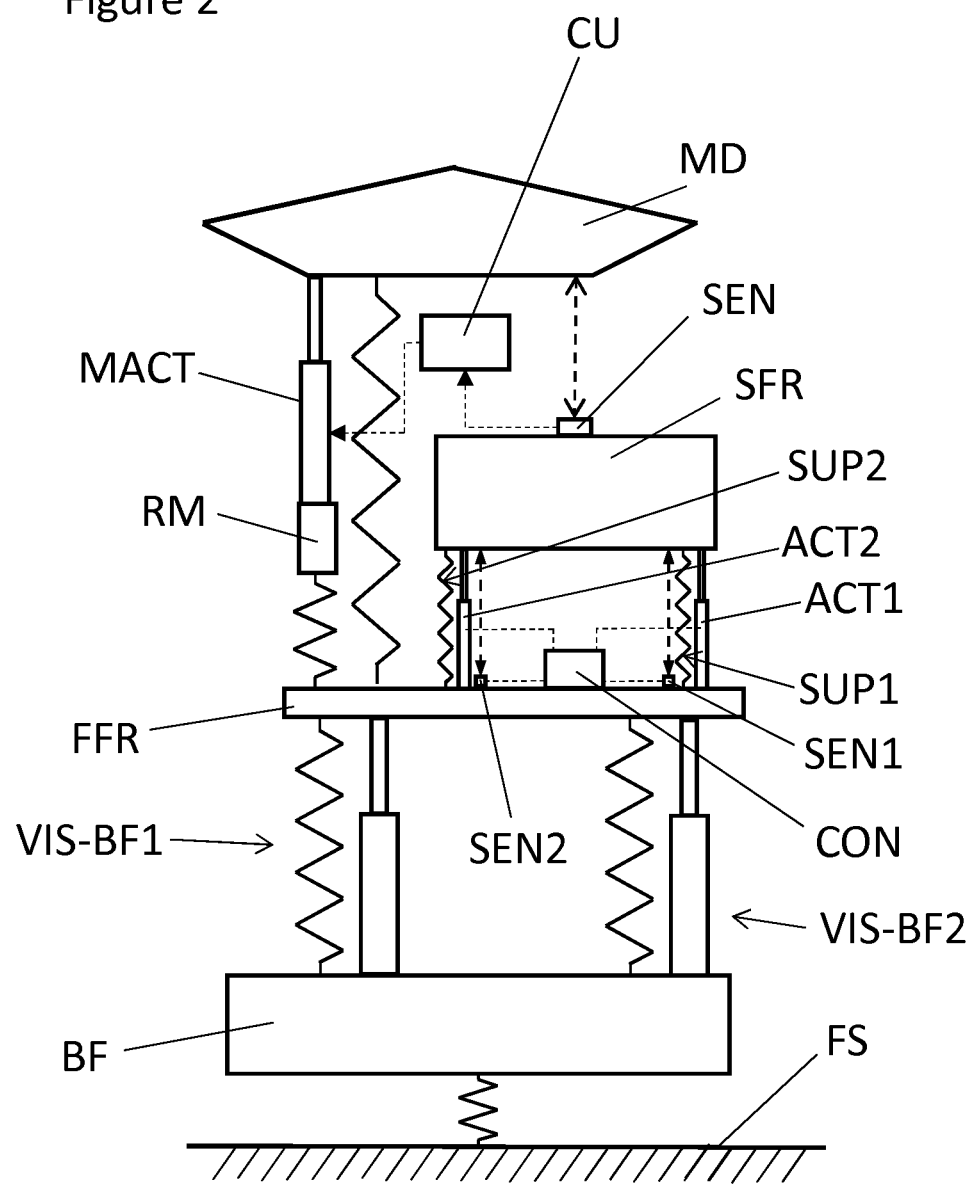
FIG. 2 shows schematically a support structure for a mirror device and a sensor frame of a lithographic apparatus, according to an embodiment of the invention.

FIG. 2 shows schematically a support structure arranged to support a mirror device MD and to support one or more sensors SEN to determine a position of the mirror device MD with respect to the one or more sensors SEN. This support structure may also be used to support other optical elements of the projection system PS.

The support structure comprises a base frame BF which is arranged on a floor surface FS, for example a factory floor. The base frame BF supports a force frame FFR supporting the mirror device MD. A first vibration isolation system VIS-BF1 and a second first vibration isolation system VIS-BF2 are arranged between the base frame BF and the force frame FFR to isolate the force frame FFR, at least partly, from vibrations of the base frame BF, for instance caused by vibration of the floor surface FS.

The first vibration isolation system VIS-BF1 and the second vibration isolation system VIS-BF2 may comprise air mounts.

The force frame FFR further supports a sensor frame SFR. On the sensor frame SFR the one or more sensors SEN are arranged to provide a sensor signal representative for a position of the mirror device MD with respect to the sensor frame SFR. The sensor signal is fed to a control unit CU which is arranged to control a mirror device actuator MACT to control a position of the mirror device MD. The mirror device actuator MACT is arranged between the mirror device MD and a reaction mass RM, which in its turn is supported on the force frame FFR.

Between the sensor frame SFR and the force frame FFR, a first support SUP1 and a second support SUP2 are arranged to support the sensor frame SFR on the force frame FFR. The first support SUP1 and the second support SUP2 may be configured as vibration isolation systems. Furthermore, a third support SUP3 and a fourth support SUP 4 are provided. In FIG. 2, the third support SUP3 and the fourth support SUP4 are not visible since the third support SUP3 and the fourth support SUP4 are arranged behind the first support SUP1 and the second support SUP2, respectively.

Figure 3:
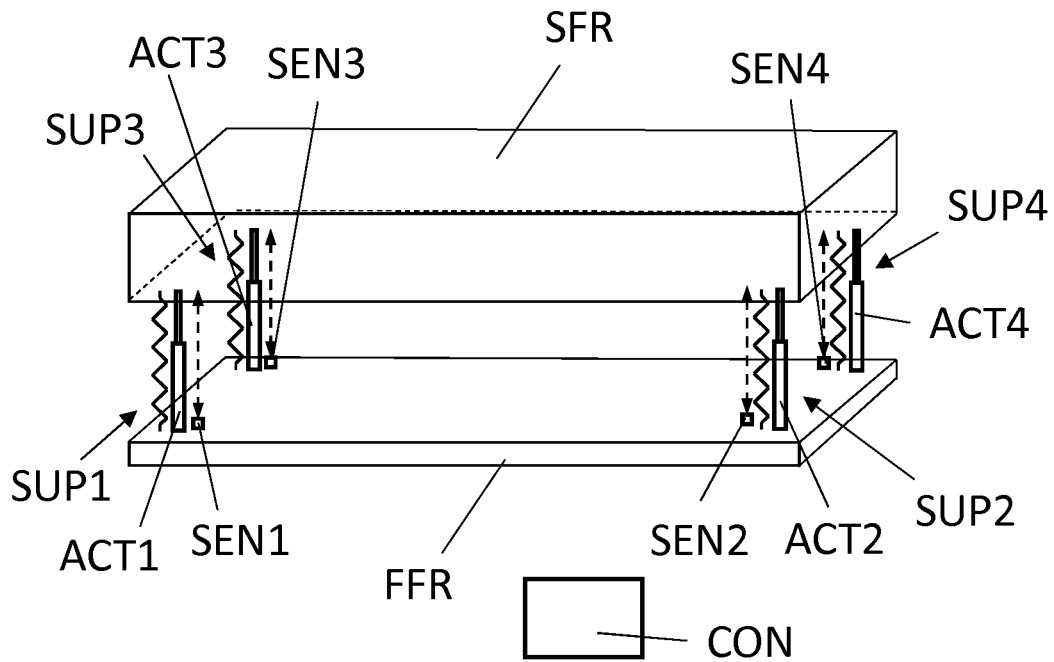
FIG. 3 shows schematically a support structure having four supports according to an embodiment of the invention.

FIG. 3 shows a perspective schematic view in which all four supports SUP1, SUP2, SUP3 and SUP4 are schematically shown.

The first support SUP1 comprises a first stiffness and is arranged to support the sensor frame SFR at a first location. The second support SUP2 comprises a second stiffness and is arranged to support the sensor frame SFR at a second location. The third support SUP3 comprises a third stiffness and is arranged to support the sensor frame SFR at a third location, and the fourth support SUP4 comprises a fourth stiffness and is arranged to support the sensor frame SFR at a fourth location.

Since each of the supports SUP1, SUP2, SUP3, SUP4 is configured to support the sensor frame SFR with a stiffness in the vertical direction, an overdetermined support structure in at least the vertical direction is provided.

It is possible that deformations occur in the force frame FFR. These deformations in the force frame FFR may for example be induced by the first vibration isolation system VIS-BF1 and the second vibration isolation system VIS-BF2 provided between the base frame BF and the force frame FFR. The deformations may also be caused by disturbances caused by flow-induced vibrations or by dynamic links stiffness, for instance stiffness of cables running from the base frame BF to the force frame FFR.

As a result of the overdetermined support of the sensor frame SFR, deformations of the force frame FFR may be transferred from the force frame FFR via the four supports SUP1, SUP2, SUP3, SUP4 to the sensor frame SFR. Since the sensor frame SFR supports one or more sensors SEN having a line of sight, i.e. a measurement direction, that extends over a substantial distance to measure a position of the mirror device MD, a small deformation of the sensor frame SFR may result in a relatively large measurement error of the sensor SEN. This measurement error may directly have a negative effect on the accuracy of the lithographic process, for example on the overlay and or focus in this lithographic process. Therefore, the transfer of deformations of the force frame FFR to the sensor frame SFR is highly undesirable.

In accordance with the present invention, the support structure is configured to prevent or at least reduce the transfer of deformations from the force frame FFR to the sensor frame SFR by actively controlling the stiffness between the force frame FFR and the sensor frame SFR using sensors and actuators.

At the first location of the first support SUP1, a first sensor SEN1 is provided to determine a position of the sensor frame SFR relative to the force frame FFR in the vertical direction. At the second location of the second support SUP2, a second sensor SEN2 is provided to determine a position of the sensor frame SFR relative to the force frame FFR in the vertical direction. Furthermore, next to the first support SUP1, a first actuator ACT1 is provided to apply a force to the sensor frame SFR relative to the force frame FFR in the vertical direction at the first location. And next to the second support SUP2, a second actuator ACT2 is provided to apply a force to the sensor frame SFR relative to the force frame FFR in the vertical direction.

As shown in FIG. 3, at the third location of the third support SUP3, a third sensor SEN3 is provided to determine a position of the sensor frame SFR relative to the force frame FFR in the vertical direction. At the fourth location of the fourth support SUP4, a fourth sensor SEN4 is provided to determine a position of the sensor frame SFR relative to the force frame FFR in the vertical direction. Furthermore, next to the third support SUP3, a third actuator ACT3 is provided to apply a force to the sensor frame SFR relative to the force frame FFR in the vertical direction at the third location. And next to the fourth support SUP4, a fourth actuator ACT4 is provided to apply a force to the sensor frame SFR relative to the force frame FFR in the vertical direction at the fourth location.

When no deformation is present in the force frame FFR the distance between the force frame FFR and the sensor frame SFR at the first location, the second location, the third location and the fourth location will not change due to static displacements. This means that a vertical static displacement of the force frame FFR will also result in a corresponding vertical displacement of the sensor frame SFR with the result of no difference between the change in the measurement result of the first sensor SEN1 and the measurement result of the second sensor SEN2, the third sensor SEN3 and the fourth sensor SEN4.

It is remarked that dynamic displacements may be damped by the vibration isolation systems of the four supports SUP1, SUP2, SUP 3, SUP 4, resulting in a temporary change of distance between the force frame FFR and the sensor frame SFR.

Also, as explained above, deformations of the force frame FFR may be transferred from the force frame FFR to the sensor frame SFR via the first support SUP1, the second support SUP2, the third support SUP3 and the fourth support SUP4.

The deformations of the force frame FFR and the sensor frame SFR caused by forces exerted on the first support SUP1, the second support SUP2, the third support SUP3 and the fourth support SUP4 will typically not be the same due to a different construction of the force frame FFR and the sensor frame SFR. For example, in practice, the sensor frame SFR may have a substantially larger mass and may be made substantially more rigid than the force frame FFR. Furthermore, the first support SUP1, the second support SUP2, the third support SUP3 and the fourth support SUP4 each have a relatively small stiffness. As a result, a deformation of the force frame FFR only will result in a relative small deformation of the sensor frame SFR. This difference in deformation may have a ratio of more than 500, for example 1000.

As a result of this difference in deformation, the deformation of the force frame FFR and the deformation of the sensor frame SFR will result in a change in a distance between the force frame FFR and the sensor frame SFR as measured by the first sensor SEN1 at the first location, as measured by the second sensor SEN2 at the second location, as measured by the third sensor SEN3 at the third location and/or as measured by the fourth sensor SEN4 at the fourth location.

Thus, on the basis of the distance measurements of the first sensor SEN1, the second sensor SEN2, the third sensor SEN3 and the fourth sensor SEN4, a deformation signal can be determined. The deformation signal is representative of a difference of deformation of the sensor frame SFR and the force frame FFR relative to each other.

It is remarked that in order to determine the deformation of the sensor frame SFR and the force frame FFR based on a difference in distance between the sensor frame SFR and the force frame FFR at the first location and at the second location, use may be made of known deformation mode shapes of the sensor frame SFR, i.e. known shapes in which the sensor frame SFR and the force frame FFR will deform. For example, when the sensor frame SFR and the force frame FFR will typically deform in an S-shape, the difference in distance between the sensor frame SFR and the force frame FFR at the first location and the second location is sufficient to determine the deformation within the sensor frame SFR and the deformation within the sensor frame SFR.

In practice, the deformation of the force frame FFR and the deformation of the sensor frame SFR will typically have the shape of a torsion deformation.

To determine the deformation signal sensor signals of the first sensor SEN1, the second sensor SEN2, the third sensor SEN3 and the fourth sensor SEN 4 are fed into a controller CON. In the controller CON, the deformation signal may be determined on the basis of torsion deformation mode shapes of the sensor frame SFR and the force frame FFR and the difference in position of the sensor frame SFR relative to the force frame FFR measured by the first sensor SEN1, the second sensor SEN2, the third sensor SEN3 and the fourth sensor SEN 4 at their respective locations. The part of the controller CON in which the deformation signal is determined may be regarded as a part of the position measurement system.

On the basis of the stiffness of each of the supports SUP1, SUP2, SUP3, SUP4 and the deformation signal, the controller CON is arranged to determine a deformation compensation signal. This deformation compensation signal can be used to drive at least one of the first actuator ACT1, the second actuator ACT2, the third actuator ACT3 and the fourth actuator ACT4 to prevent or at least reduce deformation of the sensor frame SFR to improve the measurement quality of the one or more sensors SEN arranged on the sensor frame SFR.

The deformation compensation signal is determined to counteract the stiffnesses of the first support SUP1, the second support SUP2, the third support SUP3 and the fourth support SUP4, such that the stiffness between the force frame FFR and the sensor frame SFR is substantially reduced. As a result, the transfer of the deformation of the force frame FFR to the sensor frame SFR is also substantially reduced.

Figure 4:
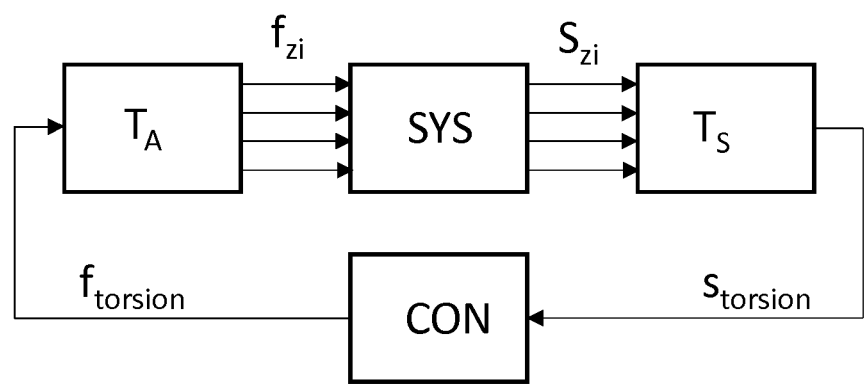
FIG. 4 shows schematically a control scheme according to the invention.

FIG. 4 shows a schematic control diagram of the support structure of FIGS. 2 and 3. The system, i.e. the support structure, is indicated as SYS. From the measurements $s_{zi}$ from the four sensors SEN1, SEN2, SEN3, SEN4, a deformation signal $s_{torsion}$ representative for the deformation, in particular torsion, of the sensor frame SFR with respect to the force frame FFR may be determined.

This deformation signal $s_{torsion}$ may be described, in a deformation measurement system $T_s$, as:

$$s_{torsion} = \Sigma_{i=1}^{4} \text{sign}(x_i y_i) s_{zi} = T_s s_z,$$

with xi and yi the locations of the supports SUP1, SUP2, SUP3, SUP4 in the horizontal plane, and $s_{zi}$, the sensor measurement of sensor i.

Correspondingly, the deformation compensation signal $f_{torsion}$ may be described in a deformation actuator system $T_A$, as:

$$f_{torsion} = \Sigma_{i=1}^{4} \text{sign}(x_i y_i) f_{zi} = T_A f_z,$$

with xi and yi the locations of the supports SUP1, SUP2, SUP3, SUP4 in the horizontal plane, and $f_{zi}$ the drive signal of actuator i.

In the controller CON the stiffness of each of the supports SUP1, SUP2, SUP3, SUP4 is used together with the deformation signal $s_{torsion}$ to provide a deformation compensation signal $f_{torsion}$ The aim of the controller CON is to reduce the effect of deformation of the force frame FFR on the deformation of the sensor frame SFR. To reduce the deformation of the sensor frame SFR, the stiffness between the force frame FFR and the sensor frame SFR should be decreased. This can be done by setting the controller CON to compensate, at least partially the positive stiffness of the supports SUP1, SUP2, SUP3, SUP4, by introducing negative stiffness with the actuators ACT1, ACT2, ACT3, ACT4.

The present sensor frame SFR and force frame FFR typically deform in a torsion mode shape. Therefore, the deformation measurement system TS and the deformation actuation system TA are both set as being [1-1-1 1]. These values are defined by the sign of the product of xi and yi.

When now a torsion deformation of the force frame FFR of [1-1-1 1] is assumed, this leads, with the torsion measurement system $T_s$ being [1-1-1 1], to a 'torsion measurement' of $s_{torsion}$=4. This means that at each of the supports SUP1, SUP2, SUP3, SUP4 the stiffness of the respective support SUP1, SUP2, SUP3, SUP4 should be compensated. An output '1' of the torsion actuation system $T_s$ leads to [1-1-1 1] [N] at each location of one of the supports SUP1, SUP2, SUP3, SUP4.

Thus, $s_{torsion}$=4 should lead to $k_{vIs}$ stiffness, with $k_{vIs}$ being the stiffness in vertical direction of each of the supports SUP1, SUP2, SUP3, SUP4, assuming the supports SUP1, SUP2, SUP3, SUP4 each have the same stiffness. Therefore, the controller CON should be equal to 0.25 $k_{vIs}$.

The resulting controller CON compensates the positive torsion stiffness of the combination of supports SUP1, SUP2, SUP3, SUP4 by introducing a negative torsion stiffness by the combination of actuators ACT1, ACT2, ACT3 and ACT4. As a result, the deformation of the force frame FFR will not be transferred or substantially less transferred to the sensor frame SFR.

Figure 5:
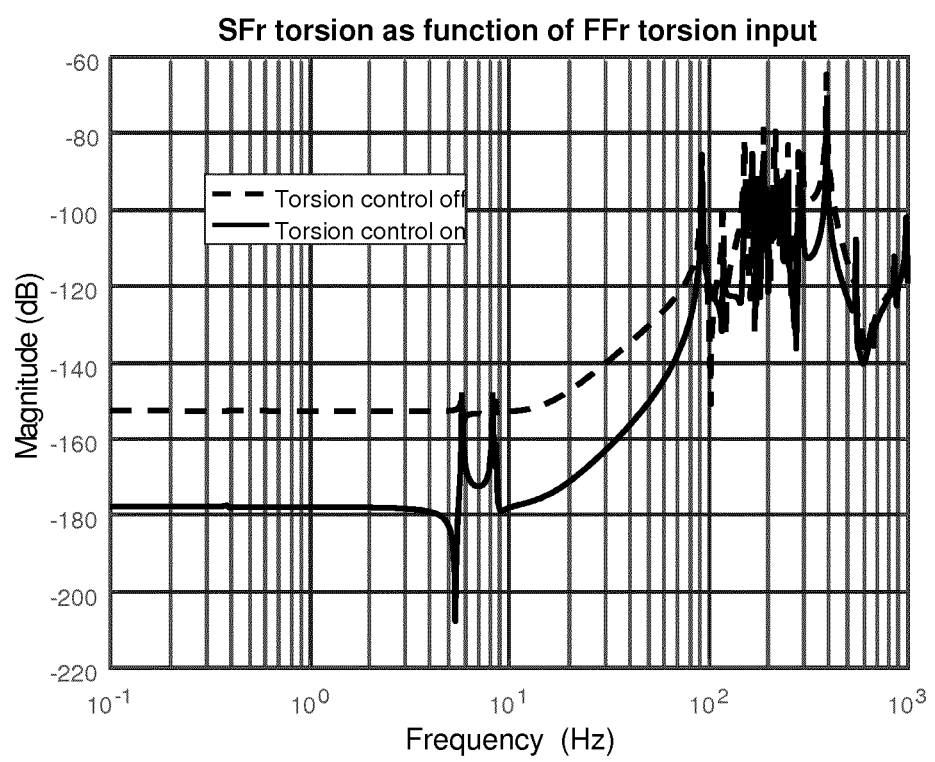
FIG. 5 shows a Bode plot of the sensor frame deformation as a result of force frame deformation with and without deformation compensation control according to the invention.

FIG. 5 shows a Bode plot of the sensor frame deformation SFR as a result of force frame deformation FFR with and without deformation compensation control according to the invention. It can be seen that the deformation of the sensor frame SFR caused by deformation of the force frame FFR is substantially reduced when the deformation compensation controller of the support structure of the present invention is activated. It has been found that the line of sight accuracy of a sensor SEN supported on the sensor SFR frame may for example be improved 40 times by use of the deformation compensation control.

Hereinabove, the compensation control is carried out in the vertical direction. In other embodiments, the compensation control may also be applied in other directions.

Hereinabove, deformation compensation control is applied to prevent or reduce the transfer of deformation from a force frames FFR to a sensor frame SFR supported by the force frame FFR. The same deformation compensation control may also be applied in other support structures in which a first body is supported by a second body and transfer of deformations from the second body to the first body should be minimized. This deformation compensation control may in particular be useful in a support structure in which the first body is substantially more rigid than the second body.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A support structure, comprising:
   a first body;
   a second body;
   a first support having a first stiffness;
   a second support having a second stiffness,
   wherein the second body supports the first body at a first location via the first support,
   wherein the second body supports the first body at a second location via the second support;
   a position measurement system arranged to generate a deformation signal representative of a relative difference between a first deformation of the first body and a second deformation of the second body;
   a first actuator to apply a force between the first body and the second body at or near the first location; and
   a second actuator to apply a force between the first body and the second body at or near the second location;
   wherein the support structure comprises a controller arranged to determine a deformation compensation signal on the basis of the first stiffness, the second stiffness and the deformation signal and to drive at least one of the first actuator and the second actuator on the basis of the deformation compensation signal to prevent or at least reduce deformation of the first body.

2. The support structure of claim 1, wherein the position measurement system comprises:
   a first sensor arranged to provide a first signal representative of a position of the first body relative to the second body at or near the first location, and
   a second sensor arranged to provide a second signal representative of a position of the first body relative to the second body at or near the second location,
   wherein the position measurement system generates the deformation signal based on the first signal and the second signal.

3. The support structure of claim 1, wherein the deformation compensation signal is determined to compensate the stiffness of the first support and/or to compensate the stiffness of the second support by driving the first actuator and/or the second actuator, respectively.

4. The support structure of claim 1, comprising:
   a third support having a third stiffness;
   a fourth support having a fourth stiffness,
   wherein the second body supports the first body at a third location via the third support,
   wherein the second body supports the first body at a fourth location via the fourth support;
   a third actuator to apply a force between the first body and the second body at or near the third location; and a fourth actuator to apply a force between the first body and the second body at or near the fourth location;

wherein the controller is arranged to determine the deformation compensation signal on the basis of the first stiffness, the second stiffness, the third stiffness, the fourth stiffness and the deformation signal.

5. The support structure of claim 4, wherein the position measurement system comprises:

a third sensor arranged to provide a third signal representative of a position of the first body relative to the second body at or near the third location, and a fourth sensor arranged to provide a fourth signal representative of a position of the first body relative to the second body at or near the fourth location, wherein the position measurement system generates the deformation signal based on the first signal, the second signal, the third signal and the fourth signal.

6. The support structure of claim 4, wherein the deformation compensation signal is determined to compensate the first stiffness of the first support, the second stiffness of the second support, the third stiffness of the third support and/or the fourth stiffness of the fourth support by driving the first actuator, the second actuator, the third actuator and/or the fourth actuator, respectively.

7. The support structure of claim 1, wherein the relative difference between the first deformation of the first body and the second deformation of the second body is determined in the vertical direction, and wherein the first actuator and the second actuator are arranged to apply a force between the first body and the second body in the vertical direction.

8. The support structure of claim 1, wherein the first deformation of the first body and/or the second deformation of the second body is determined using deformation mode shapes of the first body and/or second body, respectively.

9. The support structure of claim 1, wherein the first body is more rigid than the second body.

10. A lithographic apparatus comprising:

a support constructed to support a patterning device, the patterning device being capable of imparting a radiation beam with a pattern in its cross-section to form a patterned radiation beam;

a substrate table constructed to hold a substrate; and a projection system configured to project the patterned radiation beam onto a target portion of the substrate;

wherein the lithographic apparatus comprises the support structure of claim 1, arranged to support a first body of the lithographic apparatus with respect to a second body of the lithographic apparatus.

11. The lithographic apparatus of claim 10, wherein the first body is a sensor frame of the projection system of the lithographic apparatus and the second body is a frame supporting the sensor frame.

12. A method to prevent or at least reduce the transfer of deformation from a second body to a first body supported by the second body via at least two supports each having a stiffness and provided at a different support location of the first body, comprising:

generating a deformation signal representative of a relative difference between a first deformation of the first body and a second deformation of the second body;

determining a deformation compensation signal on the basis of the stiffness of each of the supports and the deformation signal, and driving at least one of one or more actuators provided between the first body and the second body on the basis of the deformation compensation signal to prevent or at least reduce deformation of the first body.

13. The method of claim 12, wherein driving at least one of the one or more actuators provided between the first body and the second body provides a negative stiffness to compensate the stiffness of the at least two supports.

14. The method of claim 12, wherein each actuator is associated with one support and arranged to apply a force between the first body and the second body at or near the respective support location.

15. The method of claim 12, comprising providing a signal representative of a position of the first body relative to the second body at or near each of the support locations of the respective supports, and generating the deformation signal based on the signal.

* * * * *

UNITED STATES PATENT AND TRADEMARK OFFICE
CERTIFICATE OF CORRECTION

PATENT NO. : 10,921,720 B2
APPLICATION NO. : 16/606398
DATED : February 16, 2021
INVENTOR(S) : Hans Butler Page 1 of 1

It is certified that error appears in the above-identified patent and that said Letters Patent is hereby corrected as shown below:

On the Title Page

Item (57), Line 12, replace "and the second and body" with --and the second body--.

In the Claims

In Column 14, Line 22, replace "signal, and" with --signal; and--.

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*